United States Patent
Tonomoto

(10) Patent No.: US 8,363,403 B2
(45) Date of Patent: Jan. 29, 2013

(54) SEMICONDUCTOR DEVICE ACCOMMODATING SEMICONDUCTOR MODULE WITH HEAT RADIATION STRUCTURE

(75) Inventor: Masaya Tonomoto, Obu (JP)

(73) Assignee: Denso Corporation, Kariya (JP)

( * ) Notice: Subject to any disclaimer, the term of this patent is extended or adjusted under 35 U.S.C. 154(b) by 121 days.

(21) Appl. No.: 13/074,363

(22) Filed: Mar. 29, 2011

(65) Prior Publication Data

US 2011/0242761 A1    Oct. 6, 2011

(30) Foreign Application Priority Data

Mar. 30, 2010   (JP) ................................. 2010-078256
Feb. 14, 2011   (JP) ................................. 2011-028680

(51) Int. Cl.
*H05K 7/20* (2006.01)
*F28F 7/00* (2006.01)
*H01L 23/34* (2006.01)
(52) U.S. Cl. ....... 361/699; 165/80.2; 165/80.4; 257/714
(58) Field of Classification Search .................. 257/714; 361/699
See application file for complete search history.

(56) References Cited

U.S. PATENT DOCUMENTS

| 5,001,548 | A * | 3/1991 | Iversen ........................ 257/714 |
| 7,508,668 | B2 * | 3/2009 | Harada et al. ................ 361/699 |
| 7,571,759 | B2 * | 8/2009 | Inagaki et al. ............... 165/80.4 |
| 7,956,508 | B2 * | 6/2011 | Wolf ............................. 310/203 |
| 8,125,781 | B2 * | 2/2012 | Mamitsu et al. ............. 361/702 |
| 8,151,868 | B2 * | 4/2012 | Inagaki ........................ 165/80.4 |
| 2001/0033477 | A1 | 10/2001 | Inoue et al. |
| 2004/0144996 | A1 * | 7/2004 | Inoue ............................ 257/200 |
| 2006/0219396 | A1 | 10/2006 | Abei et al. |
| 2006/0243422 | A1 * | 11/2006 | Sakai et al. .................. 165/80.4 |

FOREIGN PATENT DOCUMENTS

| JP | 2001-308266 A | 11/2001 |
| JP | 2006-287108 A | 10/2006 |
| JP | 4192396 | 10/2008 |
| JP | 2009-266937 A | 11/2009 |

OTHER PUBLICATIONS

Japanese Office Action dated Oct. 9, 2012, issued in corresponding Japanese Application No. 2011-028680, with English translation.

* cited by examiner

*Primary Examiner* — Gregory Thompson
(74) *Attorney, Agent, or Firm* — Nixon & Vanderhye PC

(57) ABSTRACT

As a result of a lower arm side having a small thermal resistance being positioned downstream of the coolant flow, cooling efficiency of the lower arm positioned on the downstream side of the coolant flow becomes higher than that of an upper arm positioned on an upstream side. Hence, rise in coolant temperature on the upstream side can be suppressed, and the first and second semiconductor chips disposed upstream and downstream can be effectively cooled. Alternatively, even when the coolant temperature rises on the upstream side, the first and second semiconductor chips disposed upstream and downstream can be effectively cooled by sufficient cooling being performed on the downstream side based on the high cooling efficiency. Therefore, the rise in semiconductor chip temperature on the downstream side to a temperature higher than that on the upstream side can be suppressed.

11 Claims, 6 Drawing Sheets

$$R2 = \frac{R21 \cdot R22}{R21 + R22} \qquad R1 = \frac{R11 \cdot R12}{R11 + R12}$$

SEMICONDUCTOR DEVICE ACCOMMODATING SEMICONDUCTOR MODULE WITH HEAT RADIATION STRUCTURE

CROSS REFERENCE TO RELATED APPLICATION

This application is based on and claims the benefit of priority from earlier Japanese Patent Application Numbers 2010-78256 filed on Mar. 30, 2010 and 2011-28680 filed on Feb. 14, 2011 the description of which is incorporated herein by reference.

BACKGROUND

1. Technical Field

The present invention relates to a semiconductor device including a semiconductor module in which a semiconductor chip and a heat sink are sealed by a resin to form an integrated structure, the semiconductor chip in which a semiconductor power element is formed of which heat radiation is performed by the heat sink. The present invention is suitably applied to a semiconductor device including a semiconductor module having, for example, a two-in-one structure in which two semiconductor power elements of an upper arm (high-side element) and a lower arm (low-side element) are sealed in a single resin sealing section.

2. Description of the Related Art

Conventionally, a semiconductor module has been disclosed that has a two-in-one structure in which an upper arm and a lower arm, each including a semiconductor power element, are connected in series. A semiconductor module disclosed, for example, in JP-B-4192396 includes insulated-gate bipolar transistors (IGBT) as the semiconductor power elements. The semiconductor module has a structure in which, in each of the upper arm and the lower arm, a heat sink is disposed with a copper block therebetween on an emitter side of a semiconductor chip in which the IGBT is formed, and a heat sink is disposed on a collector side thereof. The structure is then sealed by resin in a state in which each heat sink is exposed from a resin sealing section.

A semiconductor module having a structure such as that described above is joined to, for example, a cooling mechanism having a coolant passage through which a coolant passes. As a result, the semiconductor module can be cooled with high cooling capability. At this time, the upper arm and the lower arm are disposed in alignment on the upstream side and the downstream side of the coolant flow in the conventional semiconductor module, and thermal resistances of the heat sinks included in each arm are almost the same. Therefore, a phenomenon occurs in which the temperature of the coolant increases because of heat from the semiconductor power element disposed on the upstream side of the coolant flow, and the cooling capability on the downstream side becomes lower than that on the upstream side, thereby raising the temperature of the semiconductor power element disposed on the downstream side to become higher than that of the semiconductor power element disposed on the upstream side.

Therefore, thermal design is restricted by the semiconductor power element on the downstream side in which temperature rise occurs. As a result, alleviation of the above-described phenomenon and more effective cooling of the semiconductor power element disposed on the downstream side are desired.

SUMMARY

An embodiment provides a semiconductor device including a semiconductor module in which semiconductor chips, each in which a semiconductor power element is formed, are disposed in alignment upstream and downstream of a coolant flow, the semiconductor device in which the rise in semiconductor chip temperature on the downstream side to a temperature higher than that on the upstream side can be suppressed, and the semiconductor chips disposed upstream and downstream can be more effectively cooled.

As a first aspect of the embodiment, an example is given of a semiconductor device that cools a semiconductor module by a cooling mechanism, the semiconductor module in which first and second semiconductor chips are disposed such that respective front surfaces face opposite sides. In the semiconductor device, of an upper arm and a lower arm, the arm having a greater combined value of the thermal resistances from the first or second semiconductor chip to the heat radiating surfaces of first to third heat sinks is disposed on the upstream side of a coolant flow flowing through a coolant passage, and the arm having the smaller combined value of the thermal resistances is disposed on the downstream side.

In this way, of the upper arm and the lower arm, the arm having the greater thermal resistance is positioned upstream of the coolant flow, and the arm having the smaller thermal resistance is positioned downstream of the coolant flow. Therefore, the first and second semiconductor chips disposed upstream and downstream can be effectively cooled by the rise in coolant temperature on the upstream side being suppressed. Alternatively, even when the coolant temperature rises on the upstream side, the first and second semiconductor chips disposed upstream and downstream can be effectively cooled by sufficient cooling being performed on the downstream side based on the high cooling efficiency.

Thus, in the semiconductor device including the semiconductor module in which the first and second semiconductor chips, each in which a semiconductor power element is formed, are disposed in alignment upstream and downstream of the coolant flow, the rise in semiconductor chip temperature on the downstream side to a temperature higher than that on the upstream side can be suppressed. As a result, the first and second semiconductor chips disposed upstream and downstream can be more effectively cooled.

For example, when the first heat sink and the third heat sink are of equal size in the array direction of the upper am and the lower arm, and the length of the second heat sink is the combined length of the first heat sink and the third heat sink or longer, the upper arm is disposed on the upstream side of the coolant flow flowing through the coolant passage and the lower arm is disposed further on the downstream side thereof.

In this instance, when the third heat sink is of a size longer than the size of the first heat sink in the array direction of the upper arm and the lower arm, the cooling efficiency of the lower arm disposed further downstream of the coolant flow can be increased. Therefore, the above-described effects can be further effectively achieved.

On the other hand, when the first heat sink is of a size longer than the size of the third heat sink in the array direction of the upper am and the lower arm, a configuration may be used in which the lower arm is disposed on the upstream side of the coolant flow flowing through the coolant passage and the upper arm is disposed further on the downstream side thereof.

A following semiconductor device can be considered as another example. A semiconductor device cools a semiconductor module by a cooling mechanism, the semiconductor module in which first and second semiconductor chips are disposed such that the respective front surfaces face the same direction. Of an upper arm and a lower arm, the arm having the greater combined value of the thermal resistances from the first or second semiconductor chip to the heat radiating surfaces of the first to fourth heat sinks is disposed on the upstream side of the coolant flow flowing through the coolant passage and the arm with the smaller combined value is disposed on the downstream side.

In the semiconductor device in which the semiconductor module in which the first and second semiconductor chips are disposed such that the respective front surfaces face the same direction is cooled by the cooling mechanism in this way as well, effects similar to those described above can be achieved by the arm having the larger thermal resistance, of the upper arm and the lower arm, being disposed upstream of the coolant flow, and the arm with the smaller thermal resistance being disposed downstream of the coolant flow.

Furthermore, a configuration may be used in which either one of the first and second heat sinks on the upper arm side, and the third and fourth heat sinks on the lower arm side is of a size longer than that of the other in the array direction of the upper arm and the lower arm, and the arm of which the size is longer, of the upper arm and the lower arm, is disposed on the downstream side of the coolant flow flowing through the coolant passage and the other arm is disposed further on the upstream side thereof.

Reference numbers within the parentheses of each of the above-described means indicate correlation with specific means described in the embodiments described hereafter.

DETAILED DESCRIPTION OF THE PREFERRED EMBODIMENTS

Figure 1:
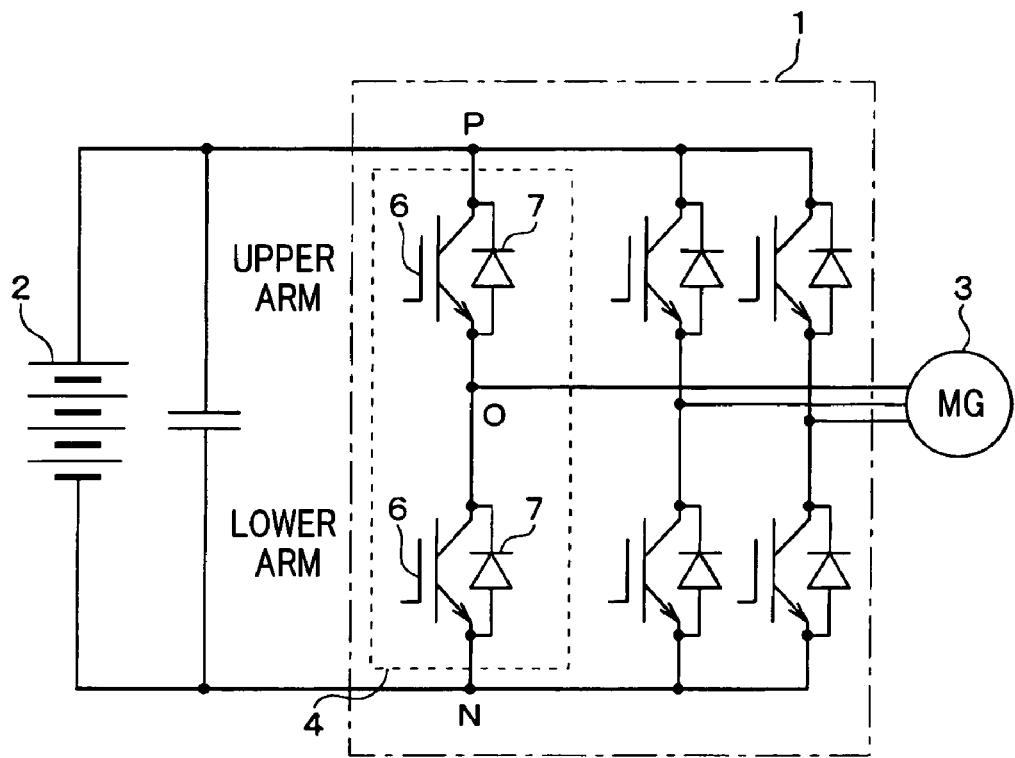
FIG. 1 is a circuit diagram of an inverter 1 according to a first embodiment of the present invention.

The preferred embodiments of the present invention will hereinafter be described with reference to the drawings. Same or equivalent sections in the embodiments below are given the same reference numbers in the drawings.

First Embodiment

A first embodiment of the present invention will be described. According to the first embodiment, a semiconductor device including a semiconductor module according to an embodiment of the present invention will be described, giving as an example an inverter having a cooling mechanism.

Figure 2:
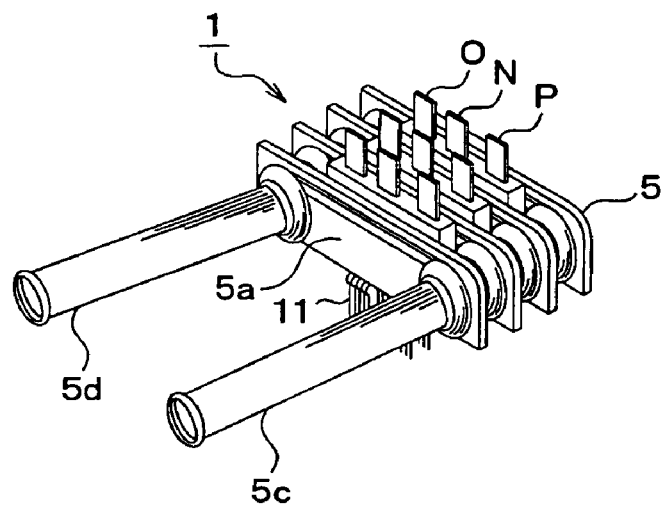
FIG. 2 is a perspective view of the inverter 1 according to the first embodiment.
Figure 3:
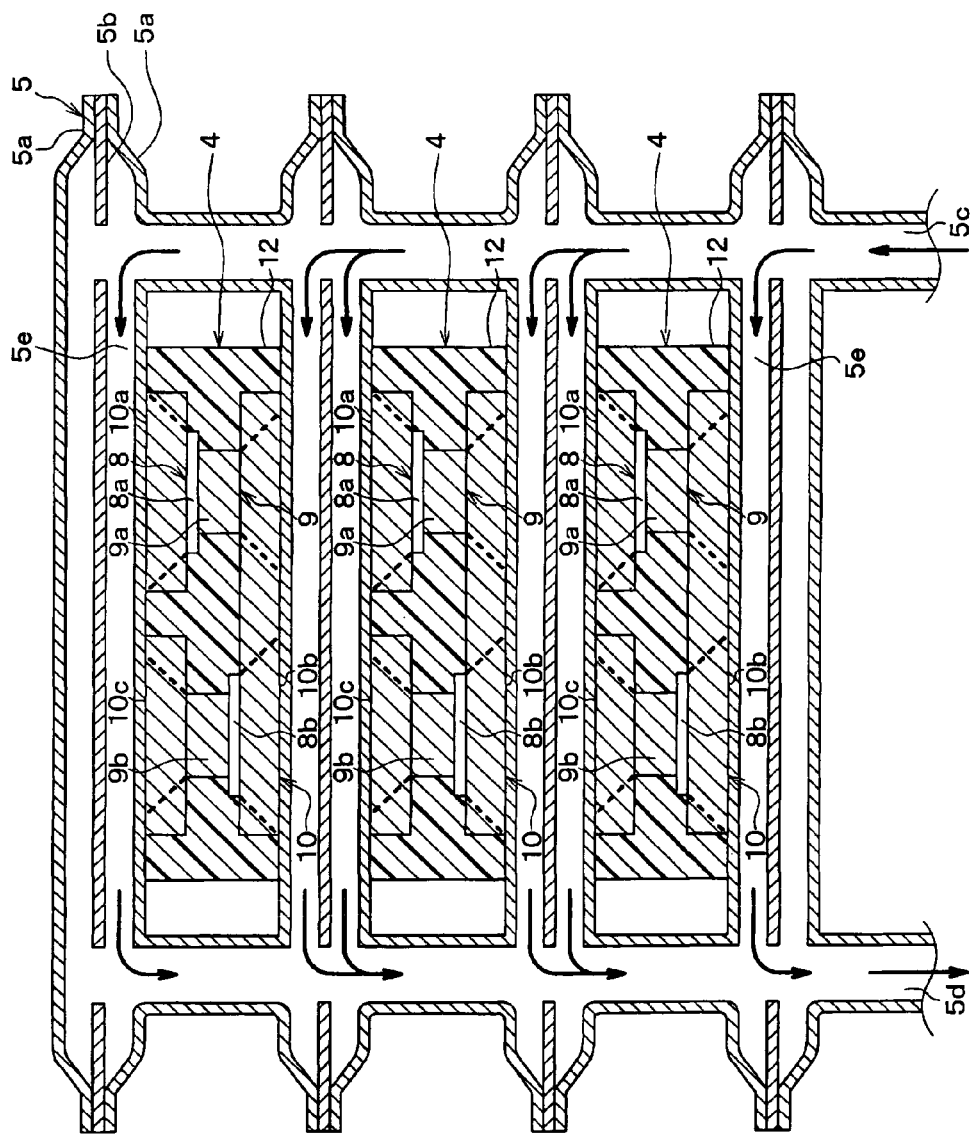
FIG. 3 is a cross-sectional view of the inverter 1 shown in FIG. 2.

FIG. 1 is a circuit diagram of an inverter 1. FIG. 2 is a perspective view of the inverter 1. FIG. 3 is a cross-sectional view of the inverter 1. FIG. 3 is equivalent to a cross-section of the inverter 1 taken on a plane perpendicular to the up/down direction of the surface of the paper on which FIG. 2 is printed.

As shown in FIG. 1, the inverter 1 is used to drive, with an alternating current, a three-phase motor 3 that is a load, based on a direct-current power supply 2. The inverter 1 is configured such that serially connected upper arms and lower arms are connected in parallel in three phases. An intermediate potential of the upper arm and the lower arm is applied while being sequentially switched between each phase of the three-phase motor 3: the U-phase, the V-phase, and the W-phase. One phase of the upper arm and the lower arm in the inverter 1 configures a single semiconductor module 4. As shown in FIG. 2 and FIG. 3, the inverter 1 is composed of three semiconductor modules 4 disposed within a cooling mechanism 5.

As shown in FIG. 1, each upper arm and each lower arm are configured by an IGBT 6 serving as a semiconductor power element and a freewheeling diode (FWD) 7. According to the first embodiment, the IGBT 6 and the FWD 7 are formed within the same semiconductor chip 8 (see FIG. 3), and configured such that an anode and a cathode of the FWD 7 are electrically connected to an emitter and a collector of the IGBT 6. A positive terminal P, a negative terminal N, and an output terminal O of the upper arm of each semiconductor module 4 are provided such as to project outward from the semiconductor module 4, as shown in FIG. 2. An anode and a cathode of the direct-current power supply 2, and the three-phase motor 3 are respectively connected to the positive terminal P, the negative terminal N, and the output terminal O, thereby forming the circuit configuration shown in FIG. 1.

As shown in FIG. 2 and FIG. 3, each semiconductor module 4 is plate-shaped and fixed within the cooling mechanism 5 such that the front and back surfaces thereof are sandwiched. The cooling mechanism 5 is formed by a metal having high thermal conductivity, such as aluminum, and composed of a plurality of plates 5a and fins 5b, a coolant supply port 5, a coolant discharge port 5d, and the like. The plurality of plates 5a and fins 5b are configured such that two plates 5a and a single fin 5b form a single set. In a state in which the fin 5b is sandwiched between the two plates 5a, the plates 5a and the fin 5b are bonded by brazing, welding, or the like, thereby forming a coolant passage 5e through which a coolant, such as cooling water, flows. The fin 5b is formed having a wavy shape in the direction perpendicular to the surface of the paper on which FIG. 3 is printed. As a result of the peak and valley portions of the wavy fin 5b coming into contact with the two plates 5a sandwiching the fin 5b, a plurality of coolant passages 5e are formed extending in the left/right directions of the surface of the paper on which FIG. 3 is printed.

A communicating hole is formed in the portion of each plate 5a and fin 5b where the coolant supply port 5c and the coolant discharge port 5d intersect. Each coolant passage 5e formed by each plate 5a and fin 5b is connected by the coolant supply port 5c and the coolant discharge port 5d. Therefore, the coolant that is supplied from the coolant supply port 5c passes through each coolant passage 5e as shown by the arrows in FIG. 2, and is discharged through the coolant discharge port 5d.

A space is provided between each set composed of the two plates 5a and the single fin 5b in the cooling mechanism 5 configured as described above. A semiconductor module 4 is sandwiched within the space and fixed by an insulating member or the like. As a result, the inverter 1 is configured having three semiconductor modules 4, or in other words, a number of semiconductor modules 4 equivalent to three phases.

Figure 4:
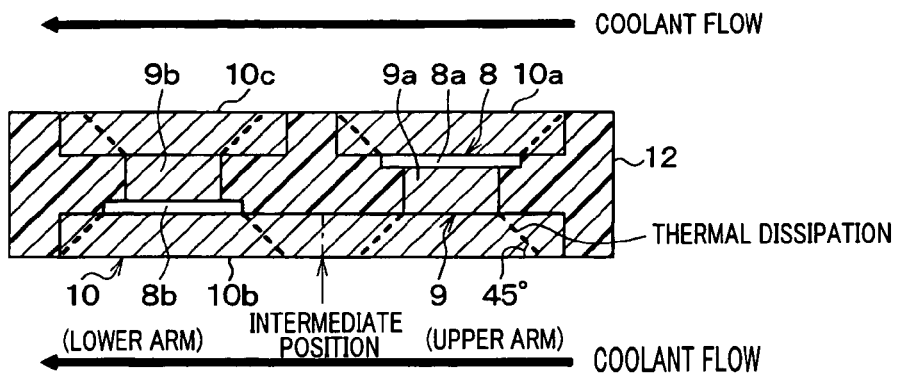
FIG. 4 is a cross-sectional view of a semiconductor module 4.
Figure 5:
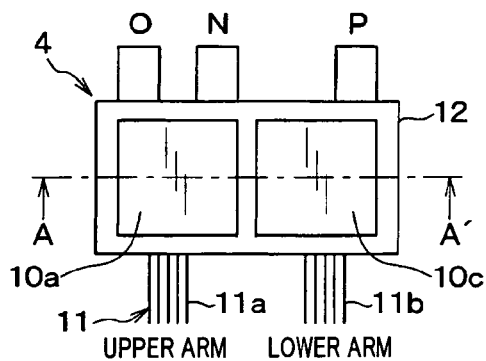
FIG. 5 is a front view of the semiconductor module 4 shown in FIG. 4.
Figure 6:
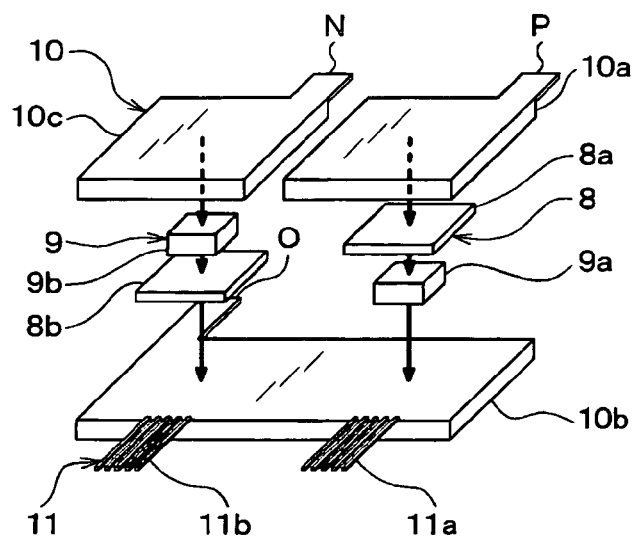
FIG. 6 is an exploded view of the semiconductor module 4 shown in FIG. 4.

Next, a detailed structure of the semiconductor module 4 included in the inverter 1 configured as described above will be described. FIG. 4 to FIG. 6 are diagrams of the semiconductor module 4, in which FIG. 4 is a cross-sectional view, FIG. 5 is a front view, and FIG. 6 is an exploded view. FIG. 4 is equivalent to a cross-section taken along line A-A' in FIG. 5.

As shown in FIG. 4 to FIG. 6, the semiconductor module 4 includes the semiconductor chip 8, a copper block 9, a heat sink 10, a gate terminal 11, and the like, which are resin-sealed by a resin sealing section 12 as shown in FIG. 4, and thereby forming an integrated structure.

The semiconductor module 4 includes two semiconductor chips 8, of which one is an upper-arm semiconductor chip 8a, and the other is a lower-arm semiconductor chip 8b. Both semiconductor chips 8a and 8b have the same structure in which the IGBT 6 and the FWD 7 are formed. The IGBT 6 and the FWD 7 formed in each semiconductor chip 8a and 8b are configured as vertical elements that send a current in the vertical direction of the substrate.

Figure 7:
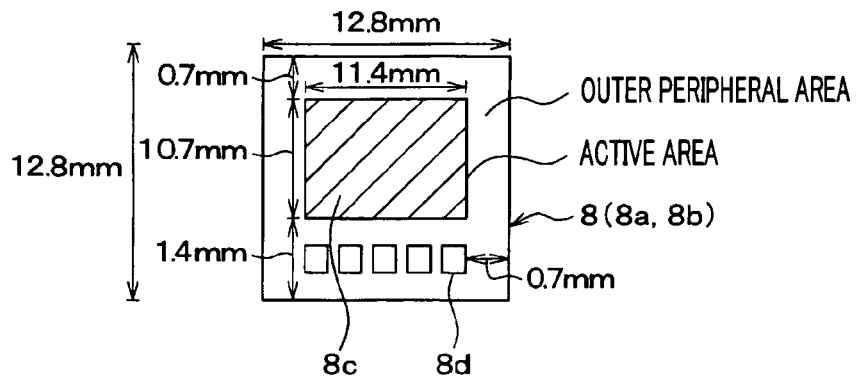
FIG. 7 is a front view of a semiconductor chip 8.

FIG. 7 is a front view of the semiconductor chip 8. On the front surface side of the semiconductor chip 8, a pad 8c that is electrically connected to the emitter of the IGBT 6 and the anode of the FWD 7 and a pad 8d that is connected to the gate of the IGBT 6 are formed. The center area of the semiconductor chip 8 in which the pad 8c is formed is an active area through which a high current generated when the IGBT 6 is turned ON flows, or a backflow current flows via the FWD 7. The periphery of the active area is an outer peripheral area that includes a pressure resistant structure, such as guard ring. The pad 8d connected to the gate is disposed such as to be led out to the outer peripheral area side. On the other hand, a pad (not shown) electrically connected to the collector of the IGBT 6 and the cathode of the FWD 7 is formed on the overall back surface on the back surface side of the semiconductor chip 8.

As shown, for example, in FIG. 7, the semiconductor chip 8 such as that described above has a dimension of 12.8 mm×12.8 mm, and the active area is 10.7 mm×11.4 mm. In the outer peripheral area surrounding the active area on four sides, the width of the side on which the pad 8d is formed is 1.4 mm, and the widths of the other sides on which the pad 8d is not formed are 0.7 mm.

The copper block 9 is equivalent to a metal block. The semiconductor module 4 includes two copper blocks 9. One copper block 9a is connected to the emitter of the IGBT 6 and the anode of the FWD 7 in the semiconductor chip 8a of the upper arm, and the other copper block 9b is connected to the emitter of the IGBT 6 and the anode of the FWD 7 in the semiconductor chip 8b of the lower arm. The copper block 9 is formed having the same area as the active area of the semiconductor chip 8, or in other words, the same size as the pad 8c, and is connected to the pad 8c by solder or the like (not shown). Therefore, the copper block 9 is of a size slightly smaller than that of the semiconductor chip 8. Specifically, the surface of the copper block 9 facing the semiconductor chip 8 is 10.7 mm×11.4 mm. The thickness of the copper block 9 is 1.7 mm.

The heat sink 10 is composed of a metal having high thermal conductivity, such as copper, and serves to transmit heat generated by the semiconductor chip 8 and serves as a current path for the IGBT 6 and the FWD 7 formed in the semiconductor chip 8. According to the first embodiment, three heat sinks 10a to 10c are included as the heat sink 10. The heat sink 10a is connected to the collector of the IGBT 6 and the cathode of the FWD 7 in the semiconductor chip 8a of the upper arm by solder or the like, and includes the positive terminal P. The heat sink 10b is connected to the copper block 9a of the upper arm, and the collector of the IGBT 6 and the cathode of the FWD 7 in the semiconductor chip 8b of the lower arm by solder or the like, and includes the output terminal O. The heat sink 10c is connected to the copper block 9b of the lower arm by solder or the like, and includes the negative terminal N.

The heat sink 10a is configured by a square plate, on one side of which the positive terminal P is formed such as to project outwards. The heat sink 10c is also configured by a square plate, on one side of which the negative terminal N is formed such as to project outwards. The heat sink 10a and the heat sink 10c are formed having the same size and the same thickness. The centers of the semiconductor chip 8a and the copper block 9b are positioned in the centers of the heat sink 10a and the heat sink 10c, and bonded thereto. The heat sink 10b has a rectangular shape, on one side of which the output terminal O is formed such as to project outwards. The heat sink 10b is formed longer than the combined length of the heat sink 10a and the heat sink 10c in the left/right directions of the surface of the paper on which FIG. 4 is printed. In addition, the length of the heat sink 10b in the direction perpendicular to the surface of the paper on which FIG. 4 is printed is equal to those of the heat sinks 10a and 10c. The thickness of the heat sink 10b is the same as those of the heat sinks 10a and 10c.

As shown in FIG. 5 and FIG. 6, the gate terminal 11 includes a gate terminal 11a for the upper arm and a gate terminal 11b for the lower arm, each of which are composed of a plurality of terminals. Each gate terminal 11a and 11b is connected to the pad 8d by a bonding wire (not shown), thereby being respectively electrically connected to the gate of the IGBT 6 in the semiconductor chip 8a of the upper arm and the gate of the IGBT 6 in the semiconductor chip 8b of the lower arm.

Each section configured as described above is disposed sequentially on the heat sink 10b, as shown in FIG. 6. In other words, on the upper arm side, the copper block 9a, the semiconductor chip 8a, and the heat sink 10a are sequentially stacked and bonded on the heat sink 10b. On the lower arm side, the semiconductor chip 8b, the copper block 9b, and the heat sink 10c are sequentially stacked and bonded on the heat sink 10b. The gate terminals 11a and 11b that are integrated by being fixed to a frame (not shown) or the like, are disposed such as to be spaced a predetermined distance away from the surface of the heat sink 10b. The pad 8d of each semiconductor chip 8a and 8b and the respective gate terminals 11a and 11b are wire-bonded. In a state in which each section is disposed in this way, the structure is set in a forming mold (not shown) or the like, and is resin-sealed by the resin sealing section 12. The heat radiating surfaces of the heat sinks 10a and 10c are exposed on the front surface of the semiconductor module 4, by one surface of the resin sealing section 12 and the heat radiating surfaces of the heat sinks 10a and 10c being flush with one another. On the back surface of the semiconductor module 4 as well, the heat radiating surface of the heat sink 10b is exposed, by one surface of the resin sealing section 12 and the heat radiating surface of the heat sink 10b being flush with each other. The positive terminal P, the negative terminal N, and the output terminal O are led out from one side surface of the resin sealing section 12, and the gate terminals 11a and 11b are lead out from a side surface on the side opposite to the one side surface. The semiconductor module 4 is configured as described above. As shown in FIG. 3 and FIG. 4, the semiconductor module 4 configured in this manner is assembled to the cooling mechanism 5 such that the upper arm is disposed on the upstream side and the lower arm is disposed on the downstream side of the coolant flow in the cooling mechanism 5.

In the semiconductor module 4 configured as described above, the positive terminal P is connected to a positive electrode of the direct-current power supply 2, the output terminal O is connected to the three-phase motor 3, and the negative terminal N is connected to a negative electrode of the direct-current power supply 2. A current supplying path to the three-phase motor 3 is formed by an operation, in which the IGBT 6 of the upper arm of one phase is turned ON and the IGBT 6 of the lower arm of another phase is turned OFF, being repeatedly performed in sequence based on the gate voltage applied to the gate of the IGBT 6. An alternating-current is thereby supplied to the three-phase motor 3. Specifically, as a result of the IGBT 6 of the upper arm being turned ON, a path is configured that supplies a current to the three-phase motor 3 from the positive terminal P via the heat sink 10a, the semiconductor chip 8a, the copper block 9a, the heat sink 10b, and the output terminal O. Furthermore, as a result of the IGBT 6 of the lower arm being turned ON, a path is configured that supplies a current from the three phase motor 3, from the output terminal O via the heat sink 10b, the semiconductor chip 8b, the copper block 9b, the heat sink 10b, and the negative terminal N. When an operation such as this is performed, each semiconductor chip 8a and 8b within the semiconductor module 4 generates heat in accompaniment with the flow of a high current to the IGBT 6 and the FWD 7. However, because the heat is radiated through the heat sinks 10a to 10c and cooled by the cooling mechanism 5, excessive temperature rise in the semiconductor chips 8a and 8b can be suppressed.

Next, operation effects of the semiconductor module 4 and the inverter 1 including the semiconductor module 4 configured as according to the first embodiment will be described.

In the semiconductor module 4 according to the first embodiment, when the semiconductor chips 8a and 8b generate heat, the heat is radiated through the heat radiating surfaces of the heat sink 10a and the heat sink 10b on the collector side of the IGBT 6 and the cathode side of the FWD 7, and the heat is radiated through the heat radiating surfaces of the heat sink 10c and the heat sink 10b on the emitter side of the IGBT 6 and the anode side of the FWD 7.

During heat radiation, according to the first embodiment, regarding respective thermal resistances of the upper arm and the lower arm, namely a combined value of the thermal resistances from each semiconductor chip 8a and 8b to the heat radiating surfaces of the heat sinks 10a to 10c, the thermal resistance is greater in the upper arm disposed on the upstream side of the coolant flow than in the lower arm disposed on the downstream side. The concept behind the thermal resistances of the upper arm and the lower arm will be described with reference to an image diagram of thermal resistance shown in FIG. 8.

As described above, according to the first embodiment, the heat generated by the semiconductor chip 8a is transmitted to the heat sink 10a and released from the heat radiating surface of the heat sink 10a. In addition, the heat is transmitted to the heat sink 10b through the copper block 9a, and released from the heat radiating surface of the heat sink 10b. The heat generated in the semiconductor chip 8b is transmitted to the heat sink 10b and released from the heat radiating surface of the heat sink 10b. In addition, the heat is transmitted to the heat sink 10c through the copper block 9b, and released from the heat radiating surface of the heat sink 10c.

Figure 8:
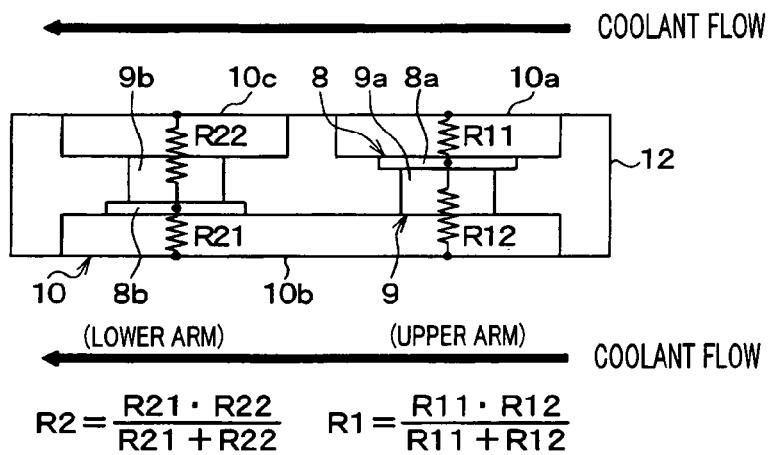
FIG. 8 is an image diagram of thermal resistance.

Therefore, as shown in FIG. 8, when the thermal resistance of the path from the semiconductor chip 8a through the heat sink 10a to the heat radiating surface is R11 and the thermal resistance of the path from the semiconductor chip 8a through the copper block 9a and the heat sink 10b to the heat radiating surface is R12, the thermal resistance R1 of the upper arm that is the upstream side of the coolant flow is a combined value of the thermal resistances R11 and R12 of the respective paths. Furthermore, when the thermal resistance of the path from the semiconductor chip 8b through the heat sink 10b to the heat radiating surface is R21 and the thermal resistance of the path from the semiconductor chip 8b through the copper block 9b and the heat sink 10c to the heat radiating surface is R22, the thermal resistance R2 of the lower arm that is the downstream side of the coolant flow is a combined value of the thermal resistances R21 and R22 of the respective paths. In other words, the thermal resistances R1 and R2 are expressed by the following expressions.

$$R1 = R11 \cdot R12 / (R11 + R12) \quad \text{(Expression 1)}$$

$$R2 = R21 \cdot R22 / (R21 + R22) \quad \text{(Expression 2)}$$

A structure is formed in which a relationship R1>R2 is established regarding the thermal resistance R1 of the upper arm and the thermal resistance R2 of the lower arm expressed as described above.

Specifically, the thermal resistances R11, R12, R21, and R22 are dependent on the respective areas of the heat sinks 10a to 10c, and the respective widths of thermal diffusion within the heat sinks 10a to 10c. Compared to the sum of the size of the heat radiating surface of the heat sink 10a and the size of the heat radiating surface of the heat sink 10c exposed on one surface side of the semiconductor module 4, the size of the heat radiating surface of the heat sink 10b is greater. Furthermore, the thermal diffusion from the semiconductor chip 8b on the lower arm side is wider than the thermal diffusion from the copper block 9 on the upper arm side within the heat sink 10b. Therefore, the thermal resistance on the lower arm side is smaller than that on the upper arm side.

In other words, the thermal diffusion can be considered to be 45 degrees, as indicated by the broken lines in FIG. 4. Therefore, the thermal diffusion of the heat sink 10a on the upper arm side directly bonded to the semiconductor chip 8a and the thermal diffusion of the lower arm side portion of the heat sink 10b directly bonded to the semiconductor chip 8b are equal, and the thermal diffusion of the upper arm side portion of the heat sink 10b bonded to the copper block 9a and the heat sink 10c on the lower arm side bonded to the copper block 9b are equal. A boundary between the portion of the heat sink 10b contributing to radiation of heat transmitted from the copper block 9a on the upper arm side and the portion of the heat sink 10b contributing to radiation of heat transmitted from the semiconductor chip 8b on the lower arm side serves as an intermediate position between the thermal diffusion on the upper arm side and the thermal diffusion on the lower arm side. Therefore, the area of the portion of the heat sink 10b contributing to radiation of heat transmitted from the semiconductor chip 8b on the lower arm side becomes greater than the area of the portion of the heat sink 10b contributing to radiation of heat transmitted from the semiconductor chip 8a on the upper arm side. As a result, the thermal resistance R21 of the path from the semiconductor chip 8b of the lower arm to the heat radiating surface of the heat sink 10b becomes smaller than the thermal resistance R11 from the semiconductor chip 8a of the upper arm to the heat radiating surface of the heat sink 10a, and the thermal resistance R2 of the lower arm becomes smaller than the thermal resistance R1 of the upper arm.

Therefore, according to the present embodiment, as described above, the semiconductor module 4 is assembled to the cooling mechanism 5 such that the upper arm having the larger thermal resistance is disposed on the upstream side of the coolant flow in the cooling mechanism 5, and the lower arm having the smaller thermal resistance is disposed on the downstream side.

As a result of the lower arm side having the smaller thermal resistance being positioned on the downstream side of the coolant flow in this way, cooling efficiency of the lower arm positioned on the downstream side of the coolant flow can be made higher than that of the upper arm positioned on the upstream side. As a result, rise in coolant temperature on the upstream side can be suppressed, and the first semiconductor chip 8a disposed upstream and the second semiconductor chip 8b disposed downstream can be effectively cooled. Alternatively, even when the coolant temperature on the upstream side increases, the first semiconductor chip 8a disposed upstream and the second semiconductor chip 8b disposed downstream can be effectively cooled by sufficient cooling being performed on the downstream side based on the high cooling efficiency.

Therefore, in the semiconductor module 4 in which the semiconductor chips 8a and 8b, each in which the IGBT 6 that is a semiconductor power element is formed, are disposed in alignment upstream and downstream of the coolant flow, the rise in semiconductor chip temperature on the downstream side to a temperature higher than that on the upstream side can be suppressed. As a result, the semiconductor chips 8a and 8b disposed upstream and downstream can be effectively cooled.

In addition, because the above-described effects can be achieved, thermal design is no longer restricted by the semiconductor chip 8b on the downstream side. Therefore, although waste (excessiveness) may occur in the heat-resistance design of the other semiconductor chip 8a when the thermal design of one semiconductor chip 8b is restricted because semiconductor chips that are basically the same are used for the semiconductor chips 8a and 8b, issues such as this can be prevented.

Second Embodiment

A second embodiment of the present invention will be described. According to the second embodiment, the structure of the semiconductor module 4 is changed from that according to the first embodiment. Other aspects are similar to those according to the first embodiment and, therefore, only sections that differ will be described.

Figure 9:
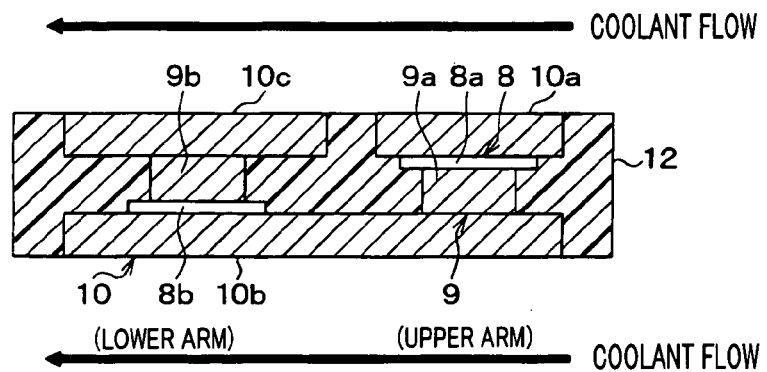
FIG. 9 is a cross-sectional view of the semiconductor module 4 according to a second embodiment of the present invention.

FIG. 9 is a cross-sectional view of the semiconductor module 4 according to the second embodiment. As shown in FIG. 9, the semiconductor module 4 according to the second embodiment basically has a similar structure as that according to first embodiment, aside from the sizes of the heat sinks 10a and 10c being changed from those according to the first embodiment. Specifically, the size of the heat sink 10c is greater than the size of the heat sink 10a in the left/right direction of the surface of the paper on which FIG. 9 is printed.

As a result of a structure such as this, the thermal resistance R2 of the lower arm disposed further downstream of the coolant flow becomes smaller than the thermal resistance R1 of the upper arm, thereby enabling the cooling efficiency of the lower arm to be increased. As a result, the effects according to the first embodiment can be more effectively achieved.

Third Embodiment

A third embodiment of the present invention will be described. According to the third embodiment, the structure of the semiconductor module 4 is changed from that according to the first embodiment. Other aspects are similar to those according to the first embodiment and, therefore, only sections that differ will be described.

Figure 10:
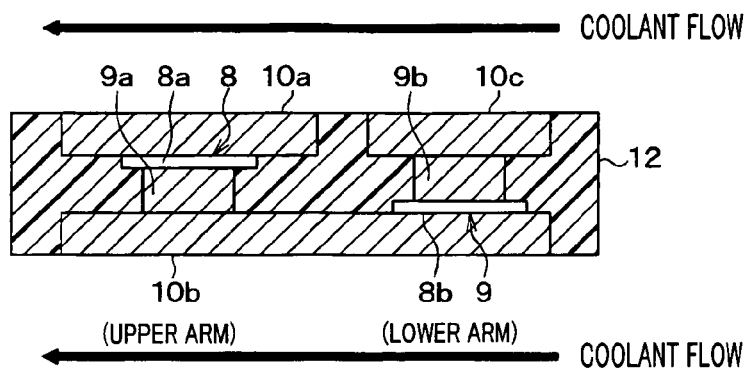
FIG. 10 is a cross-sectional view of the semiconductor module 4 according to a third embodiment of the present invention.

FIG. 10 is a cross-sectional view of the semiconductor module 4 according to the third embodiment. As shown in FIG. 10, the semiconductor module 4 according to the third embodiment basically has a similar structure as that according to first embodiment, aside from the semiconductor module 4 being assembled in the cooling mechanism 5 such that the lower arm is disposed on the upstream side of the coolant flow in the cooling mechanism 5 and the upper arm is disposed on the downstream side. The width of the heat sink 10a of the upper arm becomes wider compared to that of the heat sink 10b of the lower arm disposed on the upper stream side, in the left/right direction of the surface of the paper on which FIG. 10 is printed.

As a result of the respective sizes of the heat sink 10a to 10c being set as described above, the thermal resistance R11 of the path from the semiconductor chip 8a through the heat sink 10a to the heat radiating surface becomes smaller than the thermal resistance R22 of the path from the semiconductor chip 8b through the copper block 9b and the heat sink 10c to the heat radiating surface. Therefore, even when the thermal resistance R22 of the path from the semiconductor chip 8b through the copper block 9b and the heat sink 10c to the heat radiating surface is smaller than the thermal resistance R12 of the path from the semiconductor chip 8a through the copper block 9a and the heat sink 10b to the heat radiating surface, the thermal resistance R1 of the upper arm can be made smaller than the thermal resistance R2 of the lower arm.

Therefore, the upper arm side having the smaller thermal resistance can be positioned downstream, and the cooling efficiency of the upper arm positioned on the downstream side can be made higher than that of the lower arm positioned on the upstream side. As a result, rise in coolant temperature on the upstream side can be suppressed, and the first semiconductor chip 8a disposed downstream and the second semiconductor chip 8b disposed upstream can be effectively cooled. Alternatively, even when the coolant temperature on the upstream side increases, the first semiconductor chip 8a disposed downstream and the second semiconductor chip 8b disposed upstream can be effectively cooled by sufficient cooling being performed on the downstream side based on the high cooling efficiency.

Therefore, in the semiconductor module 4 in which the semiconductor chips 8a and 8b, each in which the IGBT 6 that is a semiconductor power element is formed, are disposed in alignment downstream and upstream of the coolant flow, the rise in semiconductor chip temperature on the downstream side to a temperature higher than that on the upstream side can be suppressed. As a result, the semiconductor chips 8a and 8b disposed downstream and upstream can be effectively cooled.

Fourth Embodiment

A fourth embodiment of the present invention will be described. According to the fourth embodiment, the structure of the semiconductor module 4 is changed from that according to the first embodiment. Other aspects are similar to those according to the first embodiment and, therefore, only sections that differ will be described.

Figure 11:
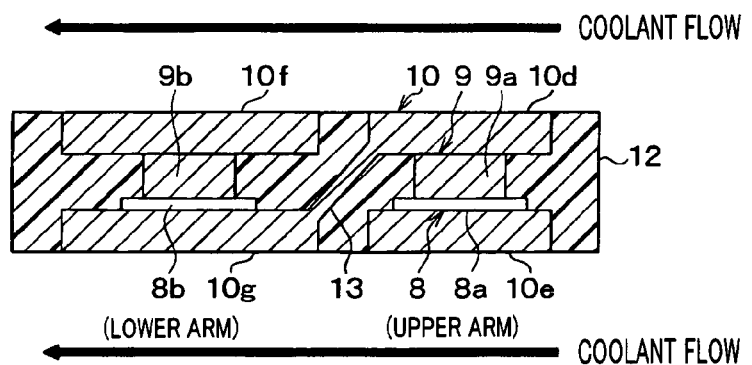
FIG. 11 is a cross-sectional view of the semiconductor module 4 according to a fourth embodiment of the present invention.

FIG. 11 is a cross-sectional view of the semiconductor module 4 according to the fourth embodiment. As shown in FIG. 11, although the semiconductor module 4 according to the fourth embodiment also has a two-in-one structure, the structure is that in which the front surface of the semiconductor chip 8a in the upper arm and the front surface of the semiconductor chip 8b in the lower arm face the same direction.

In the semiconductor module 4 according to the fourth embodiment, the emitter of the IGBT 6 and the anode of the FWD 7 of the semiconductor chip 8a in the upper arm are connected to a heat sink 10d via the copper block 9a, and the collector of the IGBT 6 and the cathode of the FWD 7 of the semiconductor chip 8a are connected to a heat sink 10e. In addition, the emitter of the IGBT 6 and the anode of the FWD 7 of the semiconductor chip 8b are connected to a heat sink 10f via the copper block 9b, and the collector of the IGBT 6 and the cathode of the FWD 7 of the semiconductor chip 8b are connected to a heat sink 10g. The surface of each heat sink 10d to 10g on the side opposite to the first and second semiconductor chips 8a and 8b is exposed from the resin sealing section 12, and the heat sink 10d and the heat sink 10g are electrically connected by a connection wire 13 within the resin sealing section 12. The connection of the connection wire 13 with the heat sink 10d and the heat sink 10g is performed by welding, soldering, or the like.

In a configuration such as that described above, in which the semiconductor module 4 in which the first and second semiconductor chips 8a and 8b are disposed such that the front surfaces face the same direction is cooled by the cooling mechanism 5, the upper arm is disposed on the upstream side of the coolant flow and the lower arm is disposed on the downstream side. In addition, the sizes of the heat sinks 10f and 10g on the lower arm side are larger than the sizes of the heat sinks 10d and 10e on the upper arm side, in the left/right directions of the surface of the paper on which FIG. 11 is printed.

Even in a structure such as this, the arm having the greater thermal resistance of the upper and lower arms can be positioned upstream of the coolant flow, and the arm having the smaller thermal resistance can be positioned downstream of the coolant flow. Therefore, the cooling efficiency of the semiconductor chip 8b on the lower arm side disposed downstream of the coolant flow can be made higher than that of the semiconductor chip 8a on the upper arm side disposed upstream. As a result, effects similar to those according to the first embodiment can be achieved.

Fifth Embodiment

A fifth embodiment of the present invention will be described. According to the fifth embodiment, the structure of the semiconductor module 4 is changed from that according to the first embodiment. Other aspects are similar to those according to the first embodiment and, therefore, only sections that differ will be described.

Figure 12:
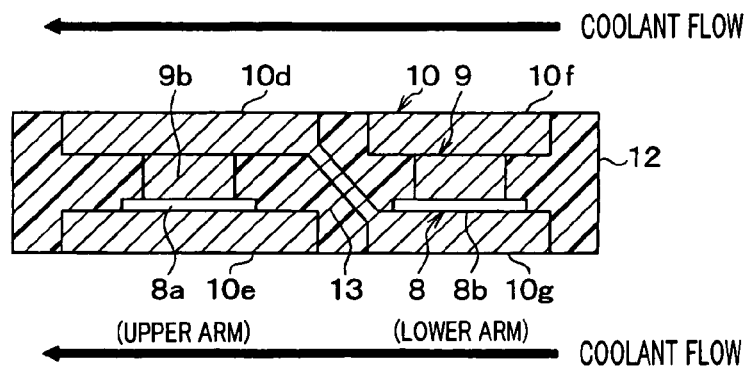
FIG. 12 is a cross-sectional view of the semiconductor module 4 according to a fifth embodiment of the present invention.

FIG. 12 is a cross-sectional view of the semiconductor module 4 according to the fifth embodiment. As shown in FIG. 12, in a manner similar to that according to the fourth embodiment, the semiconductor module 4 according to the fifth embodiment has a structure in which the front surface of the semiconductor chip 8a in the upper arm and the front surface of the semiconductor chip 8b in the lower arm face the same direction. However, according to the fifth embodiment, the lower arm is disposed on the upstream side of the coolant flow and the upper arm is disposed on the downstream side of the coolant flow. In addition, the sizes of the heat sinks 10d and 10e on the upper arm side is larger than the sizes of the heat sinks 10f and 10g on the lower arm side, in the left/right direction of the surface of the paper on which FIG. 12 is printed.

Even in a structure such as this, the arm having the greater thermal resistance of the upper and lower arms can be positioned upstream of the coolant flow, and the arm having the smaller thermal resistance can be positioned downstream of the coolant flow. Therefore, the cooling efficiency of the semiconductor chip 8b on the lower arm side disposed upstream of the coolant flow can be made higher than that of the semiconductor chip 8a on the upper arm side disposed downstream. As a result, effects similar to those according to the first embodiment can be achieved.

Other Embodiments

Figure 13:
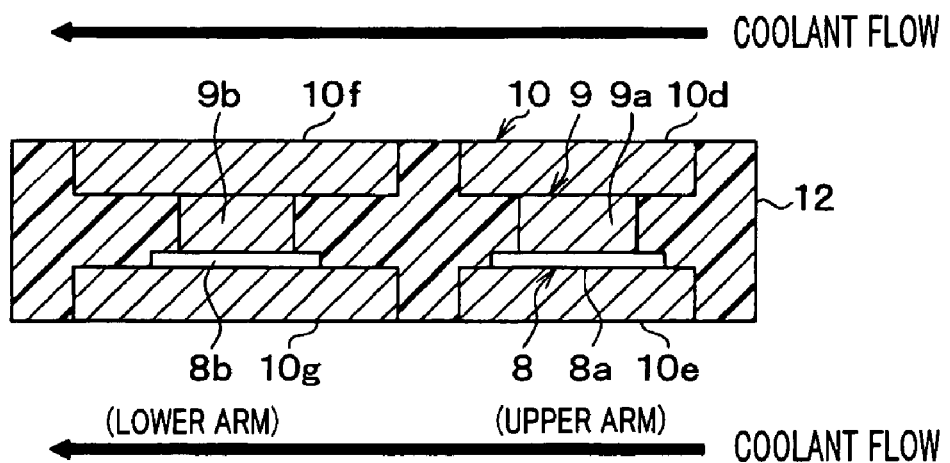
FIG. 13 is a cross-sectional view of the semiconductor module 4 described according to another embodiment.

According to the above-described fourth and fifth embodiments, a structure is described in which the heat sink 10d and the heat sink 10g within the resin sealing section 12 are electrically connected by the connection wire 13. However, the heat sink 10d and the heat sink 10g are not necessarily required to be electrically connected within the resin sealing section 12. As shown in FIG. 13, a structure may be formed in which a structure in which the semiconductor chip 8a and the copper block 9a are disposed between the heat sinks 10d and 10e configuring the upper arm and a structure in which the semiconductor chip 8b and the copper block 9b are disposed between the heat sinks 10f and 10g configuring the lower arm are simply integrated by the resin sealing section 12. In this instance, the connection can be achieved, for example, as a result of each output terminal O being projected outside of the resin sealing section 12 from the heat sink 10d and the heat sink 10g. In FIG. 13, in a manner similar to that according to the fourth embodiment, a structure is shown in which the upper arm with the greater thermal resistance is disposed on the upstream side of the coolant flow, and the lower arm with the smaller thermal resistance is disposed on the downstream side of the coolant flow. However, in a manner similar to that according to the fifth embodiment, a structure may be formed in which the lower arm with the greater thermal resistance is disposed on the upstream side of the coolant flow, and the upper arm with the smaller thermal resistance is disposed on the downstream side of the coolant flow.

According to each of the above-described embodiments, a relationship in which the thermal resistance of the arm disposed on the upstream side of the coolant flow is smaller than the thermal resistance of the arm disposed on the downstream side of the coolant flow is satisfied based on the dimensions of the heat sinks 10a to 10g. However, the resistance R1 of the upper arm and the resistance R2 of the lower arm are merely required to satisfy the relationship, and the relationship is not necessary required to be satisfied based on the dimensions of the heat sinks 10a to 10g.

Figure 14:
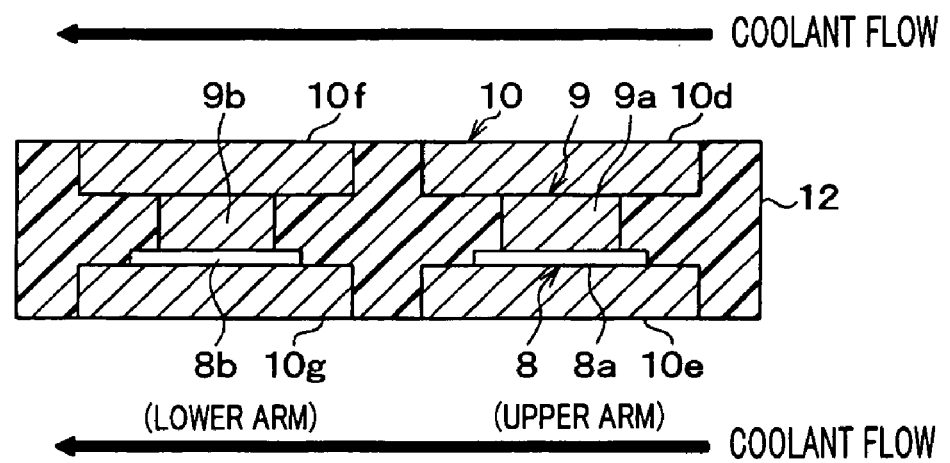
FIG. 14 is a cross-sectional view of the semiconductor module 4 described according to another embodiment.

FIG. 14 is a cross-sectional view of a structure in which the front surface of the semiconductor chip 8a in the upper arm and the front surface of the semiconductor chip 8b in the lower arm face the same direction, in an instance in which the dimensions of the heat sinks 10d to 10g are equal, and the thermal resistance R1 of the upper arm is greater than the thermal resistance R2 of the lower arm. As shown in FIG. 14, although the dimensions, namely respective widths and thickness, of the heat sinks 10d to 10g are equal, the material used to form the heat sinks 10d and 10e of the upper arm and the material used to form the heat sinks 10f and 10g differ. As a result of a different material being used for the heat sinks 10d and 10e, such as the material of the heat sinks 10f and 10g of the lower arm positioned on the downstream side of the coolant flow having higher thermal conductivity than that of the heat sinks 10d and 10e of the upper arm positioned on the upstream side, the thermal resistance R1 of the upper arm can be made greater than the thermal resistance R2 of the lower arm.

Even when the same material is used for the heat sinks 10d to 10g and the respective widths are equal, the relationship in which the thermal resistance of the arm disposed on the upstream side of the coolant flow is smaller than the thermal resistance of the arm disposed on the downstream side can be satisfied by the thicknesses of the heat sinks 10d to 10g being changed.

According to the above-described embodiments, the inverter 1 that drives the three-phase motor 3 is described. However, the semiconductor device is not limited to the inverter 1, and the semiconductor module 4 according to the first to fifth embodiments can be applied to any semiconductor device, as long as the semiconductor device can include the semiconductor module 4. For example, the semiconductor module 4 according to the first to fifth embodiments can be applied to a converter or the like.

In addition, according to the above-described embodiments, a configuration is described in which the IGBT 6 and the FWD 7 are integrally formed in the semiconductor chip 8. However, the present invention can also be applied to a structure in which the IGBT 6 and the FWD 7 are individual chips. Furthermore, although a structure in which the copper blocks 9a and 9b are separate units from the heat sinks 10b, 10c, 10d, and 10f is described, a structure may be used in which these components are integrated.

Moreover, the IGBT is described as an example of the semiconductor power element. However, the present invention can also be applied to when other elements, such as a power metal-oxide-semiconductor field-effect transistor (MOSFET), is used.

What is claimed is:

1. A semiconductor device comprising:
a semiconductor module including
a first semiconductor chip configuring an upper arm and a second semiconductor chip configuring a lower arm, each having a front surface side and a back surface side, and each in which a semiconductor power element is formed,
a first heat sink disposed on the back surface side of the first semiconductor chip,
a second heat sink disposed on the front surface side of the first semiconductor chip and the back surface side of the second semiconductor chip,
a third heat sink disposed on the front surface side of the second semiconductor chip, and
a resin sealing section that seals the first and second semiconductor chips and the first to third heat sinks, in which the surfaces of the first to third heat sinks on the side opposite of the first and second semiconductor chips serve as heat radiating surfaces and are exposed from the resin sealing section; and
a cooling mechanism including a coolant passage through which a coolant flows, that comes into contact with the heat radiating surfaces of the first to third heat sinks exposed from the resin sealing section by sandwiching the semiconductor module, and cools the first and second semiconductor chips included in the semiconductor module, wherein
of the upper arm and the lower arm, the arm with a greater combined value of thermal resistances from the first or second semiconductor chip to the heat radiating surfaces of the first to third heat sinks is disposed on an upstream side of the coolant flow flowing through the coolant passage, and the arm with the smaller combined value of the thermal resistances is disposed on a downstream side.

2. The semiconductor device according to claim 1, wherein:
the first semiconductor chip has a first metal block formed on the front surface side thereof, the first metal block being of a size smaller than that of the first semiconductor chip and being bonded to an active area of the first semiconductor chip through which a current of the first semiconductor chip flows, and the second heat sink is disposed on the side of the first metal block opposite to the first semiconductor chip; and
the second semiconductor chip has a second metal block formed on the front surface side thereof, the second metal block being of a size smaller than that of the second semiconductor chip and being bonded to an active area of the second semiconductor chip through which a current of the first semiconductor chip flows, and the third heat sink is disposed on the side of the second metal block opposite to the second semiconductor chip.

3. The semiconductor device according to claim 1, wherein;
the first heat sink and the third heat sink are of equal size in an array direction of the upper arm and the lower arm, and a length of the second heat sink is longer than a combined length of the first heat sink and the third heat sink; and
the upper arm is disposed on the upstream side of the coolant flow flowing through the coolant passage and the lower arm is disposed further downstream from the upper arm.

4. The semiconductor device according to claim 2, wherein;
the first heat sink and the third heat sink are of equal size in an array direction of the upper arm and the lower arm, and a length of the second heat sink is longer than a combined length of the first heat sink and the third heat sink; and
the upper arm is disposed on the upstream side of the coolant flow flowing through the coolant passage and the lower arm is disposed further downstream from the upper arm.

5. The semiconductor device according to claim 3, wherein the third heat sink is of a size longer than the size of the first heat sink in an array direction of the upper arm and the lower arm.

6. The semiconductor device according to claim 1, wherein:

the first heat sink is of a size longer than the size of the third heat sink in an array direction of the upper arm and the lower arm; and the lower arm is disposed on an upstream side of the coolant flow flowing through the coolant passage, and the upper arm is disposed further downstream from the lower arm.

7. The semiconductor device according to claim 2, wherein:

the first heat sink is of a size longer than the size of the third heat sink in an array direction of the upper arm and the lower arm; and the lower arm is disposed on an upstream side of the coolant flow flowing through the coolant passage, and the upper arm is disposed further downstream from the lower arm.

8. A semiconductor device comprising:

a semiconductor module including a first semiconductor chip configuring an upper arm and a second semiconductor chip configuring a lower arm, each having a front surface side and a back surface side, and each in which a semiconductor power element is formed, a first heat sink disposed on the front surface side of the first semiconductor chip, a second heat sink disposed on the back surface side of the first semiconductor chip, a third heat sink disposed on the front surface side of the second semiconductor chip, a fourth heat sink disposed on the back surface side of the second semiconductor chip, and a resin sealing section that seals the first and second semiconductor chips and the first to fourth heat sinks, in which the surfaces of the first to fourth heat sinks on the side opposite of the first and second semiconductor chips serve as heat radiating surfaces and are exposed from the resin sealing section; and a cooling mechanism including a coolant passage through which a coolant flows, that comes into contact with the heat radiating surfaces of the first to fourth heat sinks exposed from the resin sealing section by sandwiching the semiconductor module, and cools the first and second semiconductor chips included in the semiconductor module, wherein of the upper arm and the lower arm, the arm with a greater combined value of thermal resistances from the first or second semiconductor chips to the heat radiating surfaces of the first to fourth heat sinks is disposed on an upstream side of the coolant flow flowing through the coolant passage, and the arm with the smaller combined value of the thermal resistances is disposed on a downstream side.

9. The semiconductor device according to claim 8, wherein:

the first semiconductor chip has a first metal block formed on the front surface side thereof the first metal block being of a size smaller than that of the first semiconductor chip and being bonded to an active area of the first semiconductor chip through which a current of the semiconductor power element flows, and the first heat sink is disposed on the side of the first metal block opposite to the first semiconductor chip; and the second semiconductor chip has a second metal block formed on a front surface side thereof, the second metal block being of a size smaller than that of the second semiconductor chip and being bonded to an active area of the second semiconductor chip through which a current of the semiconductor power element flows, and the third heat sink is disposed on the side of the second metal block opposite to the second semiconductor chip.

10. The semiconductor device according to claim 8, wherein;

either one of the first heat sink and the second heat sink on the upper arm side, and the third heat sink and the fourth heat sink on the lower arm side is of a size longer than that of the other in an array direction of the upper arm and the lower arm; and of the upper arm and the lower arm, the arm having the longer size is disposed on the downstream side of the coolant flow flowing through the coolant passage, and the other arm is disposed further upstream thereof.

11. The semiconductor device according to claim 9, wherein;

either one of the first heat sink and the second heat sink on the upper arm side, and the third heat sink and the fourth heat sink on the lower arm side is of a size longer than that of the other in an array direction of the upper arm and the lower arm; and of the upper arm and the lower arm, the arm having the longer size is disposed on the downstream side of the coolant flow flowing through the coolant passage, and the other arm is disposed further upstream thereof.

* * * * *